United States Patent
Ikuta et al.

(10) Patent No.: US 8,426,893 B2
(45) Date of Patent: Apr. 23, 2013

(54) EPITAXIAL SUBSTRATE FOR ELECTRONIC DEVICE AND METHOD OF PRODUCING THE SAME

(75) Inventors: Tetsuya Ikuta, Chiyoda-ku (JP); Jo Shimizu, Chiyoda-ku (JP); Tomohiko Shibata, Chiyoda-ku (JP); Ryo Sakamoto, Chiyoda-ku (JP); Tsuneo Ito, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 27 days.

(21) Appl. No.: 13/319,910

(22) PCT Filed: May 10, 2010

(86) PCT No.: PCT/JP2010/003162
§ 371 (c)(1),
(2), (4) Date: Nov. 29, 2011

(87) PCT Pub. No.: WO2010/131451
PCT Pub. Date: Nov. 18, 2010

(65) Prior Publication Data
US 2012/0091435 A1   Apr. 19, 2012

(30) Foreign Application Priority Data

May 11, 2009  (JP) ................................. 2009-114860
May 10, 2010  (JP) ................................. 2010-107821

(51) Int. Cl.
*H01L 31/00*  (2006.01)
(52) U.S. Cl.
USPC ............... 257/194; 257/85; 257/77; 257/192; 257/E21.359

(58) Field of Classification Search .............. 257/76, 257/85, 194; 438/312, 332, 478, E21.09, 438/E21.359
See application file for complete search history.

(56) References Cited

U.S. PATENT DOCUMENTS 6,703,649 B2   3/2004  Shibata et al.
7,329,909 B2 *  2/2008  Saito et al. .................... 257/192
(Continued)

FOREIGN PATENT DOCUMENTS

| JP | A-2002-359255 | 12/2002 |
| JP | A-2005-085852 | 3/2005 |

(Continued)

OTHER PUBLICATIONS

Office Action issued in Japanese Patent Application No. 2010-107821 dated Oct. 19, 2010 (with translation).

(Continued)

*Primary Examiner* — Dung A. Le
(74) *Attorney, Agent, or Firm* — Oliff & Berridge, PLC

(57) ABSTRACT

An epitaxial substrate for electronic devices is provided, which can improve vertical breakdown voltage and provides a method of producing the same. The epitaxial substrate includes a conductive SiC single crystal substrate, a buffer as an insulating layer on the SiC single crystal substrate, and a main laminate formed by epitaxially growing a plurality of Group III nitride layers on the buffer. Further, the buffer includes at least an initial growth layer in contact with the SiC single crystal substrate and a superlattice laminate having a superlattice multi-layer structure on the initial growth layer. The initial growth layer is made of a $B_{a1}Al_{b1}Ga_{c1}In_{d1}N$ material. Furthermore, the superlattice laminate is configured by alternately stacking a first layer made of a $B_{a2}Al_{b2}Ga_{c2}In_{d2}N$ material and a second layer made of a $B_{a3}Al_{b3}Ga_{c3}In_{d3}N$ material having a different band gap from the first layer.

14 Claims, 3 Drawing Sheets

U.S. PATENT DOCUMENTS

| | | |
|---|---|---|
| 2003/0102482 A1 | 6/2003 | Saxler |
| 2006/0121682 A1 | 6/2006 | Saxler |
| 2010/0117094 A1 | 5/2010 | Nishikawa et al. |

FOREIGN PATENT DOCUMENTS

| | | |
|---|---|---|
| JP | A-2005-512327 | 4/2005 |
| JP | A-2006-114655 | 4/2006 |
| JP | A-2007-251144 | 9/2007 |
| JP | A-2008-085123 | 4/2008 |
| JP | A-2008-171843 | 7/2008 |
| JP | A-2008-227478 | 9/2008 |

OTHER PUBLICATIONS

International Search Report issued in International Application No. PCT/JP2010/003162 dated Aug. 10, 2010 (with translation).

* cited by examiner

US 8,426,893 B2

EPITAXIAL SUBSTRATE FOR ELECTRONIC DEVICE AND METHOD OF PRODUCING THE SAME

TECHNICAL FIELD

The present invention relates to an epitaxial substrate for electronic devices and a method of producing the same. The present invention specifically relates to an epitaxial substrate for HEMTs and a method of producing the same.

RELATED ART

In recent years, as speed required of IC devices and the like have increased, HEMTs (High electron mobility transistors) have been widely used as high-speed FETs (Field effect transistors). Such a field effect transistor is formed, as schematically illustrated in FIG. 1, for example by stacking a channel layer 22 and an electron supply layer 23 on a substrate 21 and then providing a surface of the electron supply layer 23 with a source electrode 24, a drain electrode 25, and a gate electrode 26. When the device is operated, electrons move through the source electrode 24, the electron supply layer 23, the channel layer 22, the electron supply layer 23, and the drain electrode 25 in this order. A lateral direction is a current flow direction. This movement of electrons in the lateral direction, i.e. the current flow direction, is controlled by the voltage applied to the gate electrode 26. In HEMTs, electrons generated at a joint interface between the electron supply layer 23 and the channel layer 22 which have band gaps different from each other can move significantly fast, as compared with electrons in normal semiconductors.

As such, the movement of electrons, i.e. electric current in the lateral direction is controlled by the gate voltage. In general, although the gate voltage is turned OFF, the electric current is not brought to 0. The electric current which flows when the gate voltage is OFF is called leakage current. Increase of the leakage current increases power consumption, which would consequently cause problems of heat generation and the like. Such leakage current is generally divided into lateral leakage current and vertical leakage current. Lateral leakage current refers to leakage current that flows between two electrodes (for example, between the source electrode 24 and the drain electrode 25) arranged on a surface on the electron supply layer 23 side. Vertical leakage current refers to leakage current that flows between two electrodes separately arranged on a surface on the electron supply layer 23 side and a surface on the substrate 21 side.

Now, to form an electronic device having a layered structure using a Group III nitride material, use of a SiC substrate is proposed, which is excellent in heat dissipation. Specifically, in order to suppress vertical leakage current and to improve breakdown voltage in the vertical direction at the same time, an insulating SiC substrate is generally used. However, it is difficult to make an insulating SiC substrate have higher resistance in manufacturing the substrate, which would increase the cost. Therefore, a method using a conductive SiC substrate is also proposed.

JP 2008-85123 (A) discloses a HEMT structure including a superlattice buffer layer, a channel layer, and an electron supply layer, on a conductive SiC substrate.

Further, JP 2005-85852 (A) discloses a HEMT structure including a superlattice buffer layer that is doped with p-type impurities, a channel layer, and an electron supply layer on a Si or SiC substrate with a GaN intervening layer therebetween.

However, in the invention described in JP 2008-85123, insulating properties of the superlattice buffer layer is not well considered, so the invention has a problem of deterioration in the vertical breakdown voltage. Further, the invention described in JP 2005-85852 had the following problem. When a Group III nitride layer is grown on a substrate, a GaN-based low-temperature buffer layer is used; therefore, when a SiC substrate is used, and when an Al-containing superlattice buffer layer is used for the purpose of improving the insulating properties to obtain an epitaxial substrate, the epitaxial substrate would be cracked.

DISCLOSURE OF THE INVENTION

Problems to be Solved by the Invention

An object of the present invention is to provide an epitaxial substrate for electronic devices, in which a conductive SiC substrate is used as a substrate, both decrease in the lateral leakage current and improvement in the lateral breakdown voltage characteristics are successfully achieved, and the vertical breakdown voltage is improved, and besides, crack generation is suppressed; and a method of producing the same.

Means for Solving the Problems

In order to achieve the above object, the present invention primarily includes the following components.

(1) An epitaxial substrate for an electronic device, comprising a conductive SiC single crystal substrate, a buffer as an insulating layer on the SiC single crystal substrate, and a main laminate formed by epitaxially growing a plurality of Group III nitride layers on the buffer, wherein a lateral direction is a current flow direction. The buffer includes at least an initial growth layer in contact with the SiC single crystal substrate and a superlattice laminate having a superlattice multi-layer structure on the initial growth layer. The initial growth layer is made of a $B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 \leq 1$, $a_1+b_1+c_1+d_1=1$) material. The superlattice laminate is configured by alternately stacking a first layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material and a second layer made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a different band gap from the first layer. Further, at least one of the superlattice laminate and a portion of the main laminate on the buffer side has a C concentration of $1 \times 10^{18}/cm^3$ or more.

(2) The epitaxial substrate for an electronic device, according to (1) above, wherein both the superlattice laminate and the portion of the main laminate on the buffer side has a C concentration of $1 \times 10^{18}/cm^3$ or more.

(3) The epitaxial substrate for an electronic device, according to (1) or (2) above, wherein the first layer is made of an AlN material, and the second layer is made of an $Al_{b3}Ga_{c3}N$ ($a_3=0$, $0<b_3 \leq 0.5$, $0.5 \leq c_3 < 1$, $d_3=0$) material.

(4) The epitaxial substrate for an electronic device, according to any one of (1) to (3) above, wherein the initial growth layer is made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material.

(5) The epitaxial substrate for an electronic device, according to any one of (1) to (3) above, wherein the initial growth layer is made of an AlN material.

(6) A method of producing an epitaxial substrate for an electronic device, the epitaxial substrate comprising a conductive SiC single crystal substrate, a buffer as an insulating layer on the SiC single crystal substrate, and a main laminate formed by epitaxially growing a plurality of Group III nitride layers on the buffer, wherein a lateral direction is a current flow direction. The buffer includes at least an initial growth layer in contact with the SiC single crystal substrate and a superlattice laminate having a superlattice multi-layer structure on the initial growth layer. The initial growth layer is made of a $B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 \leq 1$, $a_1+b_1+c_1+d_1=1$) material. The superlattice laminate is configured by alternately stacking a first layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material and a second layer made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a different band gap from the first layer. Further, at least one of the superlattice laminate and a portion of the main laminate on the buffer side has a C concentration of $1 \times 10^{18}/cm^3$ or more.

(7) The method of producing the epitaxial substrate for an electronic device, according to (6) above, wherein both the superlattice laminate and the portion of the main laminate on the buffer side has a C concentration of $1 \times 10^{18}/cm^3$ or more.

Effect of the Invention

An epitaxial substrate for electronic devices according to the present invention includes a buffer having an initial growth layer made of an Al-containing Group III nitride and a given superlattice laminate, and a given main laminate, on a conductive SiC substrate. The superlattice laminate and/or a portion of the main laminate on the buffer side has a C concentration of $1 \times 10^{18}/cm^3$ or more, so that not only both decrease in the lateral leakage current and improvement in the lateral breakdown voltage characteristics are successfully achieved, but also vertical breakdown voltage can be improved. Moreover, use of the conductive SiC substrate can improve heat dissipation and reduce crack generation.

Further, with a producing method according to the present invention, an epitaxial substrate for electronic devices, which includes a buffer having an initial growth layer made of an Al-containing Group III nitride and a given superlattice laminate, and a given main laminate, can be produced. The superlattice laminate and/or a portion of the main laminate on the buffer side has a C concentration of $1 \times 10^{18}/cm^3$ or more, so that not only both decrease in the lateral leakage current and improvement in the lateral breakdown voltage characteristics are successfully achieved, but also vertical breakdown voltage can be improved. Besides, use of a conductive SiC substrate can improve heat dissipation and reduce crack generation.

MODES FOR CARRYING OUT THE INVENTION

Figure 2:
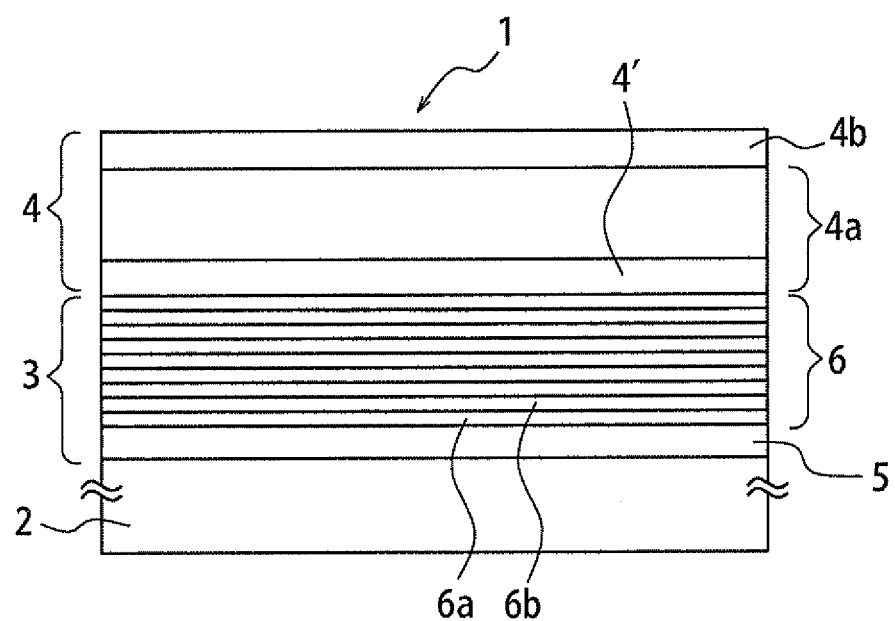
FIG. 2 is a schematic cross-sectional view of an epitaxial substrate for electronic devices according to the present invention.

Next, an embodiment of an epitaxial substrate for electronic devices according to the present invention will be described with reference to the drawings. FIG. 2 schematically shows a cross-section structure of an epitaxial substrate for electronic devices according to the present invention. Note that the epitaxial substrate in FIG. 2 is enlarged in the thickness direction for the sake of explanation.

As shown in FIG. 2, an epitaxial substrate 1 for electronic devices according to the present invention has the following characteristic features. The lateral direction is a current flow direction. The epitaxial substrate 1 comprises a conductive SiC single crystal substrate 2, a buffer 3 as an insulating layer formed on the conductive SiC single crystal substrate 2, and a main laminate 4 formed by epitaxially growing a plurality of Group III nitride layers on the buffer 3. The buffer 3 at least includes an initial growth layer 5 in contact with the Si single crystal substrate 2 and a superlattice laminate 6 having a superlattice multi-layer structure on the initial growth layer 5. The initial growth layer 5 is made of a $B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 \leq 1$, $a_1+b_1+c_1+d_1=1$) material. In addition, the superlattice laminate 6 is formed by alternately stacking a first layer 6a made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material and a second layer 6b made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a different band gap from the first layer 6a. The superlattice laminate 6 and/or a portion 4' of the main laminate 4 on the buffer 3 side has a C concentration of $1 \times 10^{18}/cm^3$ or more. With such a structure, not only both decrease in the lateral leakage current and improvement in the lateral breakdown voltage characteristics are successfully achieved, but also vertical breakdown voltage can be improved. Moreover, use of the conductive SiC substrate can improve heat dissipation and suppress crack generation.

Substrates having various crystal structures may be used for the conductive SiC single crystal substrate 2; specifically, a 4H or 6H substrate is preferable. The crystal plane is not limited in particular, and (0001), (10-10), (11-20) planes and the like can be used. However, to grow the (0001) plane of a Group III nitride with good surface flatness, the (0001) plane is desirably used. Further, either p-type or n-type conductivity may be employed. With respect to the conductivity of the SiC single crystal substrate 2, a low resistance substrate having a resistivity of 1000 Ω·cm or less can be used as appropriate depending on the use. Note that SiC substrates having a resistivity of 1000 Ω·cm pr less are herein referred to as conductive SiC substrates. Such a conductive SiC single crystal substrate 2 can be produced using various methods such as a sublimation method; alternatively, SiC can be homoepitaxially grown on a surface of a substrate. Further, a substrate having a surface provided with a thin film formed from an oxide film, a nitride film, or a carbide film can be used. Note that the reason that it is difficult to increase the resistivity of the SiC substrate is because nitrogen, which is the main constituent of air, easily contaminates the SiC substrate as an impurity, i.e. an n-type dopant, to reduce resistivity.

Further, the initial growth layer 5 is formed of an Al-containing Group III nitride material ($B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 \leq 1$, $a_1+b_1+c_1+d_1=1$)), so that crack generation in an Al-containing superlattice laminate to be described later can be suppressed. In order to prevent cracks effectively, the initial growth layer 5 preferably has higher Al composition than the layer which has the least Al composition in the superlattice laminate. In terms of the effect of preventing cracks, the initial growth layer 5 is more preferably made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material and most preferably made of an AlN. This is because the foregoing compositions can effectively suppress stretching stress in the superlattice laminate. Note that the AlN material here may include a minute amount of impurities of 1% or less regardless of whether the inclusion was intended or not intended. For example, the AlN may include Ga or In above or other impurities such as Si, H, O, C, B, Mg, As, or P. The thickness of the initial growth layer is preferably within the range of 10 nm to 200 nm. When the initial layer is too thin, the stretching stress in the superlattice laminate cannot be fully suppressed, so cracks would occur in the superlattice laminate. When the initial layer is too thick, the stretching stress in the initial layer would accumulate to generate cracks in the initial layer.

Figure 1:
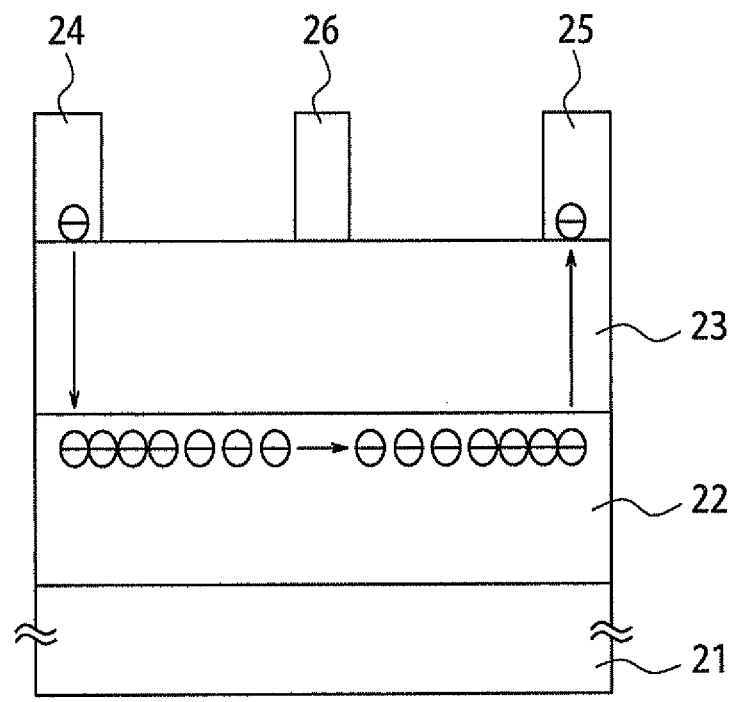
FIG. 1 is a schematic cross-sectional view illustrating a typical field effect transistor.

Now, "the lateral direction is a current flow direction" refers to a state where, as illustrated in FIG. 1, electric current flows from the source electrode 24 to the drain electrode 25, mainly in the width direction of the laminate, This state is different from, for example, the state where electric current flows mainly in the vertical direction, that is, the direction of the thickness of the laminate as in a structure in which a semiconductor is sandwiched between a pair of electrodes.

Further, alternate stacking for forming the superlattice laminate here means to stack in such a way that the laminate cyclically includes the first layer 6a and the second layer 6b. The laminate can include layers other than the first layer 6a and the second layer 6b (such as a compositional transition layer).

The concentration of C in the portion 4' of the main laminate 4 on the buffer 3 side is preferably higher than the concentration of C in the superlattice laminate 6. In the portion 4', due to the difference of the lattice constant between the buffer 3 and the main laminate 4, a phenomenon in which dislocation bends in a lateral or oblique direction is observed, which forms a path allowing leakage current to flow easily. Therefore, leakage current flows more easily in the portion 4' than in the buffer layer 3. To suppress this leakage current, the C concentration as described above is desired. Further, when the thickness of this portion 4' of the main laminate 4 on the buffer 3 side is less than 0.1 μm, the dislocation would noticeably bend even in a portion with low C concentration, Therefore the thickness is preferably set to 0.1 μm or more. The upper limit of the thickness of the portion 4' is not specified in particular in terms of breakdown voltage improvement and reduction in leakage current, and it is set as appropriate in terms of reducing warpage and cracks of the substrate.

The first layer 6a and the second layer 6b which constitute the superlattice laminate 6 are preferably made of an AlN material and an AlGaN ($a_3=0$, $0<b_3\leq0.5$, $0.5\leq c_3<1$, $d_3=0$) material, respectively. Since the band gap difference between the first layer 6a and the second layer 6b improves vertical breakdown voltage, the Al composition difference is preferably made as large as possible so that the band gap difference becomes as large as possible. When a mixed crystal is formed using a Group III nitride semiconductor material, AlN (6.2 eV) and GaN (3.5 eV) have the largest band gap difference; therefore, the superlattice structure is preferably formed from an AlGaN material. When the lower limit of the Al composition difference is less than 0.5, relaxation of stress due to lattice constant difference between Si single crystals and a Group III nitride is insufficient, which causes cracks; therefore, the composition difference is preferably 0.5 or more. Further, with respect to the upper limit of the composition difference, the Al composition difference is preferably large; however, it is desired that the second layer having a small band gap contains at least Al, and the Al composition difference is smaller than 1 since insulation of the AlGaN layer itself is promoted to improve breakdown voltage. This is because when the second layer contains at least Al, C can be efficiently introduced. Provided that the number of superlattice pairs is at least 40 pairs or more and the total film thickness is 1 μm or more, variation in breakdown voltage can be reduced, which is preferable. As this superlattice layer is thicker, the breakdown voltage can be increased, which is preferable for uses under high voltage. However, there is a disadvantage in that the material cost increases. Therefore, the thickness of the superlattice layer is selected as appropriate depending on the use.

With respect to the thickness of each layer in terms of improving breakdown voltage, the thickness of the first layer 6a having a large band gap is preferably larger enough to suppress a tunnel current and is preferably smaller enough to prevent cracks. For example, when AlN is used, the thickness of the first layer 6a is preferably 2 nm to 10 nm, The thickness of the second layer 6b is set as appropriate in terms of suppressing cracks and controlling warpage. Preferably, the thickness of the layer having a relatively small band gap may be larger than that of the layer having a relatively large band gap to make the superlattice multilayer structure effectively demonstrate a strain-alleviating effect and suppress generation of cracks, and may be 40 nm or less. Further, the layers in the superlattice laminate are not necessarily stacked with the same film thickness, or the same composition.

The epitaxial substrate 1 for electronic devices can be used for various uses where the lateral direction is the current flow direction. It is preferably used for HEMTs. The main laminate 4 of the epitaxial substrate 1 shown in FIG. 2 may include a channel layer 4a made of a $B_{a4}Al_{b4}Ga_{c4}In_{d4}N$ ($0\leq a_3\leq1$, $0\leq b_3\leq1$, $0\leq c_3\leq1$, $0\leq d_3\leq1$, $a_3+b_3+c_3+d_3=1$) material and an electron supply layer 4b made of a $B_{a5}Al_{b5}Ga_{c5}In_{d5}N$ ($0\leq a_5\leq1$, $0\leq b_5\leq1$, $0\leq c_5\leq1$, $0\leq d_5\leq1$, $a_5+b_5+c_5+d_5=1$) material having a larger band gap than the channel layer 4a. On this occasion, either layer can be made of a single or a plurality of compositions. In particular, to prevent alloy scattering and to lower resistivity at the current flowing portion, at least a portion of the channel layer 4a which is in contact with the electron supply layer 4b is preferably made of a GaN material.

A portion of the channel layer 4a on the side opposite to the buffer layer preferably has a low C concentration, and the concentration is preferably set at $4\times10^{16}/cm^3$ or less. This is because since this portion corresponds to the current flowing portion of an electronic device, it is preferable that the portion does not include impurities which hinder electrical conductivity or generate current collapse. Further, in order to suppress leakage owing to remaining carriers caused by n-type impurities, the C concentration is preferably $1\times10^{15}/cm^3$ or more.

Next, an embodiment of a producing method of an epitaxial substrate for electronic devices according to the present invention will be described with reference to the drawings.

In a method of producing an epitaxial substrate 1 for electronic devices, as shown in FIG. 2, a buffer 3 as an insulating layer and a main laminate 4 having a HEMT structure including a plurality of Group III nitride layers epitaxially grown on the buffer 3 are formed in this order on a conductive SiC single crystal substrate 2, in which the lateral direction is a current flow direction. The epitaxial substrate 1 is characteristically formed as follows. The buffer 3 includes an initial growth layer 5 in contact with the SiC single crystal substrate 2 and a superlattice laminate 6 having a superlattice multilayer structure on the initial growth layer 5; the initial growth layer 5 is made of a $B_{a1}Al_{b1}Ga_{c1}In_{d1}N$ ($0\leq a_1\leq1$, $0<b_1\leq1$, $0\leq c_1\leq1$, $0\leq d_1\leq1$, $a_1+b_1+c_1+d_1=1$) material; the superlattice laminate 6 is configured by alternately stacking a first layer 6a made of a $B_{a2}Al_{b2}Ga_{c2}In_{d2}N$ ($0\leq a_2\leq1$, $0\leq b_2\leq1$, $0\leq c_2\leq1$, $0\leq d_2\leq1$, $a_2+b_2+c_2+d_2=1$) material and a second layer 6b made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a band gap different from the first layer 6a, and the superlattice laminate 6 and/or a portion 4' of the main laminate on the buffer 3 side has a C concentration of $1 \times 10^{18}/cm^3$ or more. With such a structure, an epitaxial substrate for electronic devices can be manufactured in which vertical breakdown voltage characteristics and lateral breakdown voltage characteristics are both favorably achieved, and lateral leakage current can be reduced. The amounts of the other impurities are not limited in particular; however, intrusion of donor impurities (Si, O, Ge) having a relatively shallow impurity level is preferably suppressed. When C is contained as much as being able to compensate such a donor level, the intrusion of donor impurities is permitted to some extent. Note that with respect to the impurity concentration, while etching is performed from the surface side, the impurity concentration profile in the depth direction was measured using SIMS analysis. On this occasion, if the Group III element composition of only the portion 4' is modified, or the C concentration or the Group III element composition of a portion of the channel layer 4a on the side opposite to the buffer layer is changed from the portion 4', the modification may be either abrupt or continuous.

C to be added to the superlattice laminate 6 and the portion 4' of the main laminate 4 on the buffer 3 side can be added by several methods shown below when the laminate is grown by CVD.

First method: A source gas containing C is additionally added during the growth of a Group III nitride. Methane, ethane, ethylene, acetylene, benzene, cyclopentane, and the like are given as examples.

Second method: A methyl group, an ethyl group, or the like in an organic metal is mixed into an epitaxial growth layer depending on the Group III nitride growth conditions. The growth temperature, growth pressure, growth rate; and the ammonia flow rate, hydrogen flow rate, or nitrogen flow rate at the time of growth; and the like are determined as appropriate so as to suppress decomposition of the organic metal; thus, the concentration of C to be added to the epitaxial growth layer can be controlled.

Note that, in the present invention, the concentration of C in the superlattice laminate 6 is a value measured by SIMS at a spot of the superlattice laminate 6 exposed after the half thickness of the superlattice laminate 6 is removed. The concentration of C in the portion 4' of the main laminate 4 on the buffer 3 side is a value measured by SIMS at a spot of the portion 4' exposed after the half thickness of the portion 4' is removed.

Note that FIG. 1 and FIG. 2 merely show examples of representative embodiments, and the present invention is not limited to these embodiments. For example, interlayers which would not adversely affect the effect of the present invention may be inserted or another superlattice layer may be inserted between each layer, or the composition may be graded. Further, a nitride film, a carbide film, an Al layer, or the like can be formed on the conductive SiC single crystal surface.

Note that the layered structure of the present invention can be applied not only to conductive SiC substrates, but also to other conductive substrates made of a variety of metal materials or low resistance semiconductor materials (such as Ge, GaN, AlGaN, GaAs, and ZnO) in which cracks generate if the initial growth layer is GaN. This can provide advantages of the present invention in that even when using a conductive substrate, crack generation can be suppressed, lateral leakage current is reduced, and breakdown voltage characteristics in the lateral direction and the vertical direction can be improved.

EXAMPLES

Experiment Example 1

On each of 300 µm-thick 3 inch 6H—SiC (0001) plane single crystal substrates having a resistivity of $1 \times 10^{-1}$ Ω·cm, 10 Ω·cm, and 100 Ω·cm, an initial growth layer (AlN material, thickness: 100 nm) and a superlattice laminate (AlN, film thickness: 4 nm and $Al_{0.15}Ga_{0.85}N$, film thickness: 25 nm, 85 layers in total) were grown to form a buffer. A channel layer (GaN material, thickness: 1.5 µm) and an electron supply layer ($Al_{0.25}Ga_{0.75}N$ material, thickness: 20 nm) were epitaxially grown on the superlattice laminate to form a main laminate having a HEMT structure. Thus, Samples 1 to 3 were obtained. The concentration of C in the superlattice laminate was changed, and the concentration of C in a portion of the main laminate on the buffer side was in the range of $1.5 \times 10^{18}/cm^3$ to $2.0 \times 10^{18}/cm^3$ in each result. Further, a portion of the channel layer on the electron supply layer side had a C concentration in the range of $0.8 \times 10^{16}/cm^3$ to $3.5 \times 10^{16}/cm^3$. The growth temperature and pressure of each layer are shown in Table 1. $P_1$ in the table was controlled to control the C concentration, and the deposition pressure was reduced to increase the C concentration. MOCVD was used as a growth method. TMA (trimethylaluminium) and TMG (trimethylgallium) were used as Group III materials, and ammonia was used as a Group V material. Hydrogen gas and nitrogen gas were used as carrier gases. The deposition temperature here means a temperature of the substrate itself, measured during the growth using a radiation thermometer. Note that the SIMS measurement of the C concentration was performed by etching from the epitaxial layer side with a measuring apparatus manufactured by Cameca using $Cs^-$ as an ion source at an ion energy of 8 keV.

TABLE 1

| Layer | Growth pressure (kPa) | Growth temperature (° C.) |
|---|---|---|
| Initial growth layer | 10 | 1025 |
| Superlattice laminate | $P_1$ (1-120) | 1025 |
| Channel layer (buffer side) | 10 | 1025 |
| Channel layer (electron supply layer side) | 100 | 1075 |
| electron supply layer | 10 | 1025 |

Figure 3:
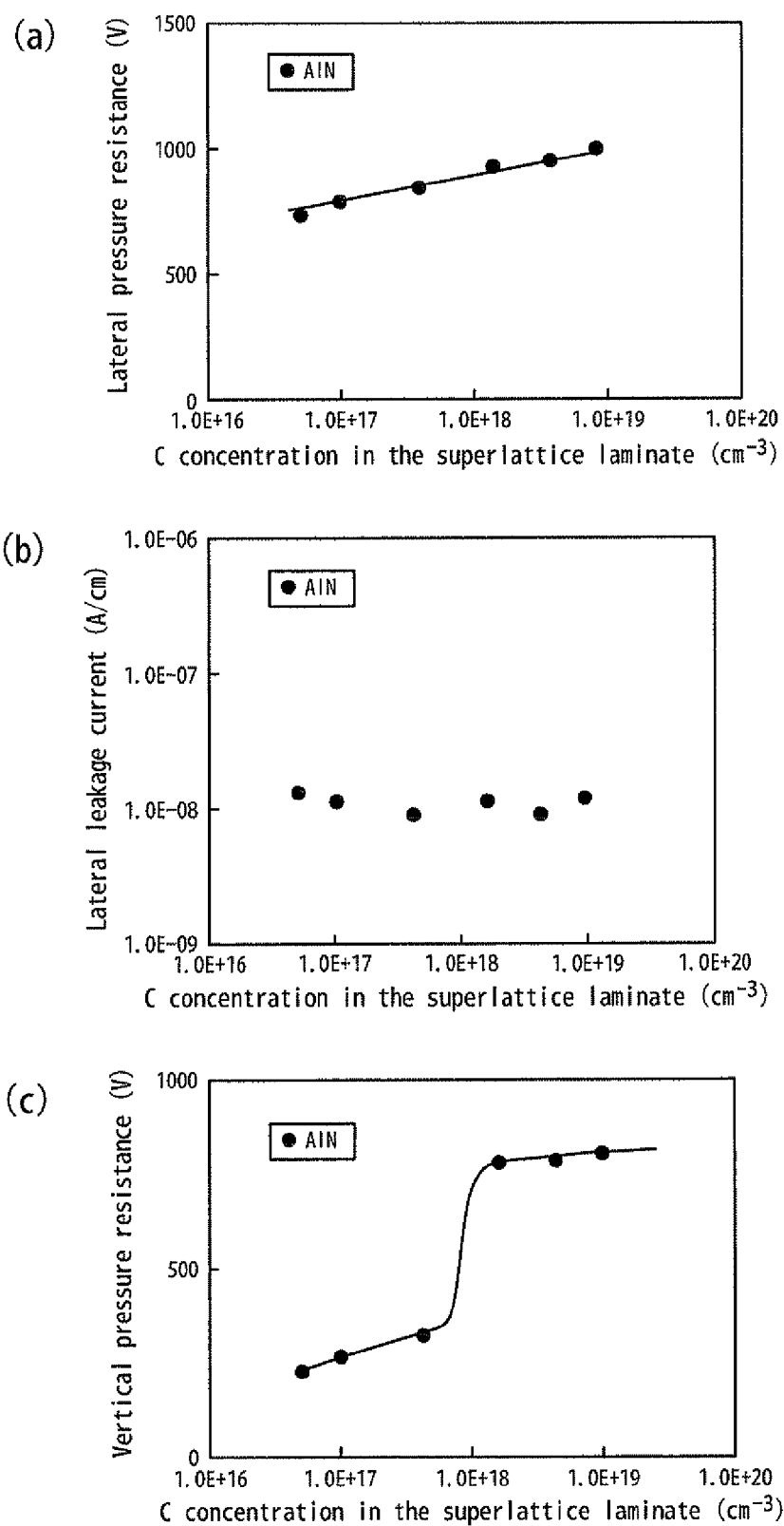
FIGS. 3(a), 3(b) and 3(c) are graphs showing measurement results of the lateral breakdown voltage, the lateral leakage current, and the vertical breakdown voltage, respectively.

FIG. 3(a), FIG. 3(b), and FIG. 3(c) show measurement results of the lateral breakdown voltage, the lateral leakage current, and the vertical breakdown voltage of Sample 2, respectively. The measurement was performed as follows.

Vertical direction: a 80 µmφ ohmic electrode having a Ti/Al layered structure was formed on the substrate surface, and the outside of the ohmic electrode was etched by a thickness of 50 nm. After that, the rear surface of the substrate was grounded to a metal plate, and the value of electric current flowing between the electrodes was measured with changing a voltage.

Lateral direction: 200 µm□ (square) two electrodes having a Ti/Al layered structure were formed to be arranged so that a side of each electrode was 10 µm distant from each other, and a portion around the ohmic electrodes was etched by a thickness of 150 nm. After that, the value of electric current flowing between the electrodes was measured with changing a voltage. On this occasion, to suppress electric discharge in the air, the electrodes were insulated from each other using an insulating oil. Further, for the purpose of avoiding the influence of leakage to the rear surface of the substrate, an insulating plate was placed under the substrate.

In this experiment example, the vertical breakdown voltage was defined as such a voltage value that a value obtained by converting the value of vertical current into the value per unit area by dividing by the electrode area amounts to $10^{-4} A/cm^2$; the lateral breakdown voltage was defined as such a voltage value that a value obtained by converting the value of lateral current into the value per side length of the electrodes amounts to $10^{-4} A/cm$; and the lateral leakage current was defined as a value of current at a lateral voltage of 100 V between the two electrodes.

The concentration of C in the superlattice laminate 6 was obtained by measurement using SIMS, at a spot of the superlattice laminate 6 exposed after the half thickness of the superlattice laminate 6 is removed. The concentration of C in the portion 4' of the main laminate 4 on the buffer 3 side was obtained by measurement using SIMS, at a spot of the portion 4' exposed after the half thickness of the portion 4' was removed.

As a result of changing the concentration of C in the superlattice laminate, the lateral breakdown voltage and the lateral leakage current did not almost change; however, the vertical breakdown voltage of Sample 2 was found to specifically increase steeply as the concentration of C in the superlattice laminate exceeded $1 \times 10^{18}/cm^3$. Note that Samples 1 and 3 had similar results to FIG. 3(*a*), FIG. 3(*b*), and FIG. 3(*c*).

Note that as electrical characteristics of the channel layer portion in the epitaxial substrate fabricated in each experiment example were measured by Hall effect measurement, they were found to exhibit favorable characteristics such as a sheet resistance value of 440Ω/☐ (square) or less and a mobility of 1570 $cm^2/Vs$ or more.

The surface of each epitaxial substrate fabricated in the experiment example was observed under an optical microscope (100 power), and no cracks were found.

Experiment Example 2

Samples 4 to 6 were fabricated by similar methods to Samples 1 to 3 in Experiment Example 1 except that the growth pressure of the superlattice laminate was set at 10 kPa, the concentration of C in the portion of the main laminate on the buffer side was changed, and the growth temperature and pressure of each layer were set as shown in Table 2. $P_2$ in the table was controlled to control the C concentration, and the deposition pressure was reduced to increase the C concentration. The concentration of C in the superlattice laminate was in the range of $1.5 \times 10^{18}/cm^3$ to $2.5 \times 10^{18}/cm^3$ in each result.

TABLE 2

| Layer | Growth pressure (kPa) | Growth temperature (° C.) |
|---|---|---|
| Initial growth layer | 10 | 700 |
| Superlattice laminate | 10 | 1025 |
| Channel layer (buffer side) | $P_2$ (1-120) | 1025 |
| Channel layer (electron supply layer side) | 100 | 1075 |
| electron supply layer | 10 | 1025 |

Figure 4:
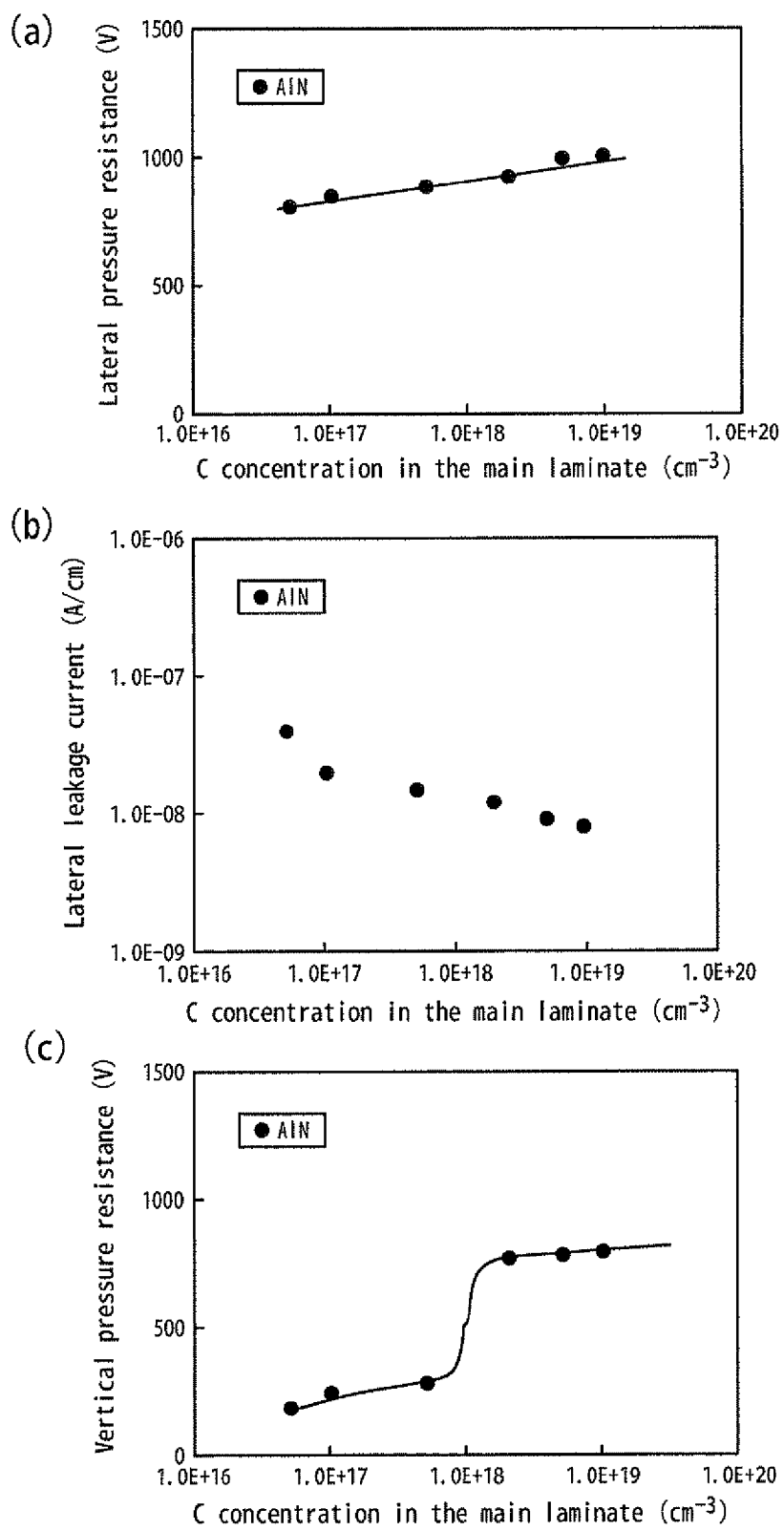
FIGS. 4(a), 4(b) and 4(c) are graphs showing measurement results of the lateral breakdown voltage, the lateral leakage current, and the vertical breakdown voltage, respectively.

FIG. 4(*a*), FIG. 4(*b*), and FIG. 4(*c*) show measurement results of the lateral breakdown voltage, the lateral leakage current, and the vertical breakdown voltage of Sample 4, respectively. As a result of changing the concentration of C in the main laminate, the lateral breakdown voltage and the lateral leakage current did not almost change; however, the vertical breakdown voltage of Sample 4 was found to specifically increase steeply as the concentration of C in the portion of the main laminate on the buffer side exceeded $1 \times 10^{18}/cm^3$. Further, as in Experiment Example 1 there was no significant difference found even in Samples 5 and 6 each using the Si single crystal substrate having a different resistivity, from the results shown in FIGS. 4(*a*) to 4(*c*).

The surface of each epitaxial substrate fabricated in the experiment example was observed under an optical microscope (100 power), and no cracks were found.

Experiment Examples 1 and 2 above indicate that when one of the concentration of C in the superlattice laminate and the concentration of C in the portion of the main laminate on the buffer side is set at $1 \times 10^{18}/cm^3$ or more, the vertical breakdown voltage can be increased effectively.

Experiment Example 3

Sample 7 was fabricated by a similar method to Sample 2 in Experiment Example 1 except that the initial growth layer was made of a GaN material (thickness: 20 nm) grown at 700° C., and the growth temperature and pressure of each layer were set as shown in Table 3.

TABLE 3

| Layer | Growth pressure (kPa) | Growth temperature (° C.) |
|---|---|---|
| Initial growth layer | 10 | 700 |
| Superlattice laminate | $P_1$ (1-120) | 1025 |
| Channel layer (buffer side) | 10 | 1025 |
| Channel layer (electron supply layer side) | 100 | 1075 |
| electron supply layer | 10 | 1025 |

When the surface of each epitaxial substrate fabricated in the experiment example was observed under an optical microscope (100 power), many cracks were found to generate. The cracks were generated in the entire surface of the wafer, which made it impossible to fabricate an experimental device.

Experiment Example 4

Samples 8 to 10 were fabricated by similar methods to Samples 1 to 3 in Experiment Example 1 except that the initial growth layer was made of an $Al_{0.5}Ga_{0.5}N$ material to perform the same experiments. As a result, each sample was found to have a similar result to FIG. 3(*a*), FIG. 3(*b*), and FIG. 3(*c*), and to exhibit favorable characteristics such as a sheet resistance value of 450Ω/☐ (square) or less and a mobility of 1550 $cm^2/Vs$ or more.

The surface of each epitaxial substrate fabricated in the experiment example was observed under an optical microscope (100 power), and no cracks were found.

Experiment Example 5

Samples 11 to 13 were fabricated by similar methods to Samples 4 to 6 in Experiment Example 2 except that the initial growth layer was made of an $Al_{0.5}Ga_{0.5}N$ material to perform the same experiments. As a result, each sample was found to have a similar result to FIG. 4(*a*), FIG. 4(*b*), and FIG. 4(*c*).

The surface of each epitaxial substrate fabricated in the experiment example was observed under an optical microscope (100 power), and no cracks were found.

INDUSTRIAL APPLICABILITY

An epitaxial substrate for electronic devices according to the present invention includes a buffer having an Al-containing initial growth layer and a given superlattice laminate, and a given main laminate on a conductive SiC substrate; and the superlattice laminate and/or a portion of the main laminate on the buffer side has a C concentration of $1 \times 10^{18}/cm^3$ or more. Thus, not only both decrease in the lateral leakage current and improvement in the lateral breakdown voltage characteristics are successfully achieved, but also vertical breakdown voltage can be improved. Moreover, use of the conductive SiC substrate can improve heat dissipation and reduce crack generation.

REFERENCE NUMERALS

| | REFERENCE NUMERALS |
|---|---|
| 1: | Epitaxial substrate for electronic devices |
| 2: | Conductive SiC single crystal substrate |
| 3: | Buffer |
| 4: | Main laminate |
| 4a: | Channel layer |
| 4b: | Electron supply layer |
| 5: | Initial growth layer |
| 6: | Superlattice laminate |
| 6a: | First layer |
| 6b: | Second layer |

The invention claimed is:

1. An epitaxial substrate for an electronic device, comprising:
   a conductive SiC single crystal substrate,
   a buffer as an insulating layer on the SiC single crystal substrate, and
   a main laminate formed by epitaxially growing a plurality of Group III nitride layers on the buffer,
   wherein a lateral direction is a current flow direction,
   the buffer includes at least an initial growth layer in contact with the SiC single crystal substrate and a superlattice laminate having a superlattice multi-layer structure on the initial growth layer,
   the initial growth layer is made of a $B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 \leq 1$, $a_1+b_1+c_1+d_1=1$) material,
   the superlattice laminate is configured by alternately stacking a first layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material and a second layer made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a different band gap from the first layer, and
   at least one of the superlattice laminate and a portion of the main laminate on the buffer side has a C concentration of $1 \times 10^{18}/cm^3$ or more.

2. The epitaxial substrate for an electronic device, according to claim 1,
   wherein both the superlattice laminate and the portion of the main laminate on the buffer side has a C concentration of $1 \times 10^{18}/cm^3$ or more.

3. The epitaxial substrate for an electronic device, according to claim 1,
   wherein the first layer is made of an AlN material, and the second layer is made of an $Al_{b3}Ga_{c3}N$ ($a_3=0$, $0 < b_3 \leq 0.5$, $0.5 \leq c_3 < 1$, $d_3=0$) material.

4. The epitaxial substrate for an electronic device, according to claim 1,
   wherein the initial growth layer is made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material.

5. The epitaxial substrate for an electronic device, according to claim 1,
   wherein the initial growth layer is made of an AlN material.

6. A method of producing an epitaxial substrate for an electronic device, the epitaxial substrate comprising:
   a conductive SiC single crystal substrate,
   a buffer as an insulating layer on the SiC single crystal substrate, and
   a main laminate formed by epitaxially growing a plurality of Group III nitride layers on the buffer,
   wherein a lateral direction is a current flow direction,
   the buffer includes at least an initial growth layer in contact with the SiC single crystal substrate and a superlattice laminate having a superlattice multi-layer structure on the initial growth layer,
   the initial growth layer is made of a $B_{a1}Al_{b1}Ga_{c1}In_{d1}N$ ($0 \leq a_1 \leq 1$, $0 < b_1 \leq 1$, $0 \leq c_1 \leq 1$, $0 \leq d_1 1$, $a_1+b_1+c_1+d_1=1$) material,
   the superlattice laminate is configured by alternately stacking a first layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_1+b_2+c_2+d_2=1$) material and a second layer made of a $B_{a3}Al_{b3}Ga_{c3}In_{d3}N$ ($0 \leq a_3 \leq 1$, $0 \leq b_3 \leq 1$, $0 \leq c_3 \leq 1$, $0 \leq d_3 \leq 1$, $a_3+b_3+c_3+d_3=1$) material having a different band gap from the first layer, and
   at least one of the superlattice laminate and a portion of the main laminate on the buffer side has a C concentration of $1 \times 10^{18}/cm^3$ or more.

7. The method of producing the epitaxial substrate for an electronic device, according to claim 6,
   wherein both the superlattice laminate and the portion of the main laminate on the buffer side each has a C concentration of $1 \times 10^{18}/cm^3$ or more.

8. The epitaxial substrate for an electronic device, according to claim 2,
   wherein the first layer is made of an AlN material, and the second layer is made of an $Al_{b3}Ga_{c3}N$ ($a_3=0$, $0 < b_3 \leq 0.5$, $0.5 \leq c_3 < 1$, $d_3=0$) material.

9. The epitaxial substrate for an electronic device, according to claim 2,
   wherein the initial growth layer is made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material.

10. The epitaxial substrate for an electronic device, according to claim 3,
    wherein the initial growth layer is made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material.

11. The epitaxial substrate for an electronic device, according to claim 8,
    wherein the initial growth layer is made of a $B_{a1}Al_{b1}Ga_{c1}In_{d1}N$ ($0 \leq a_1 \leq 1$, $0.5 \leq b_1 \leq 1$, $0 \leq c_1 \leq 1$, $0 \leq d_1 \leq 1$, $a_1+b_1+c_1+d_1=1$) material.

12. The epitaxial substrate for an electronic device, according to claim 2,
    wherein the initial growth layer is made of an AlN material.

13. The epitaxial substrate for an electronic device, according to claim 3,
wherein the initial growth layer is made of an AlN material.

14. The epitaxial substrate for an electronic device, according to claim 8,
wherein the initial growth layer is made of an AlN material.

* * * * *